United States Patent
Chen et al.

(10) Patent No.: US 6,791,837 B2
(45) Date of Patent: Sep. 14, 2004

(54) HEAT DISSIPATING ASSEMBLY WITH AIR GUIDE DEVICE

(75) Inventors: Fu-Ming Chen, Tu-chen (TW); Deyi Shi, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 57 days.

(21) Appl. No.: 10/335,326

(22) Filed: Dec. 30, 2002

(65) Prior Publication Data

US 2004/0100768 A1 May 27, 2004

(30) Foreign Application Priority Data

Nov. 22, 2002 (TW) ..................................... 91218819 U

(51) Int. Cl.[7] .............................................. H05K 7/20
(52) U.S. Cl. ..................... 361/695; 165/80.3; 165/121; 165/185; 361/697; 361/703; 415/177; 454/184
(58) Field of Search ............... 62/259.2; 165/80.2–80.3, 165/121–122, 126, 185; 361/687, 696–695, 697, 703; 415/177–178; 454/184

(56) References Cited

U.S. PATENT DOCUMENTS

| | | | | |
|---|---|---|---|---|
| 5,917,697 A | * | 6/1999 | Wang ......................... | 361/695 |
| 6,113,485 A | * | 9/2000 | Marquis et al. .............. | 454/184 |
| 6,145,586 A | * | 11/2000 | Lo .............................. | 165/80.3 |
| 6,464,578 B1 | * | 10/2002 | Chin et al. ................... | 454/184 |
| 6,587,335 B1 | * | 7/2003 | Nelson et al. .............. | 361/687 |
| 6,690,577 B2 | * | 2/2004 | Chen .......................... | 361/695 |

* cited by examiner

*Primary Examiner*—Gregory D. Thompson
(74) *Attorney, Agent, or Firm*—Wei Te Chung

(57) ABSTRACT

A heat dissipating assembly includes a heat sink (120) attached on an electronic package (110), a fan (140) mounted to the heat sink, and an air guide device (20). The air guide device includes a duct (21) fixedly attached to a computer enclosure (40) at an air opening (42) thereof, and a hood (25) adjustably connected to the duct. The hood has a connection portion (26) adjustably connected to the duct, and a cover portion (29). The duct defines annular grooves (22) in an outer circumferential surface thereof, and the connection portion forms protrusions (28) on an inner surface thereof. The protrusions are engaged in selected annular grooves, to retain the hood on the duct at a desired position. The cover portion of the hood is near to and aligned with the fan. Heated air blown by the fan passes directly through the duct and out of the enclosure.

18 Claims, 5 Drawing Sheets

HEAT DISSIPATING ASSEMBLY WITH AIR GUIDE DEVICE

BACKGROUND OF THE INVENTION

1. Field of the Invention

The present invention relates to heat dissipating devices, and particularly to a heat dissipating assembly incorporating an air guide device for enhancing an efficiency of heat dissipation.

2. Related Art

During operation of a computer, heat is generated by the electrical components thereof, especially by electronic packages such as central processing units (CPUs). High-speed processing of signals by a CPU results in a correspondingly high amount of heat being generated. Thus, cooling of CPUs is an important consideration in designing computers. Generally, a heat sink and a fan are used to dissipate heat generated by the CPU. The heat is radiated by the heat sink to ambient air, and heated air is conveyed by the fan to an exterior of the computer via an air opening. However, heated air often cannot freely flow out of the computer through the air opening. After the computer has operated for a period of time, a large amount of heated air may accumulate within the computer. This can lead to instability or even failure of the CPU and other electrical components inside the computer.

TW patent publications Nos. 288627 and 352172 each disclose a heat dissipation assembly for overcoming the above-mentioned problems. Each heat dissipation assembly comprises a heat sink module and a ducting means. One end of the ducting means is attached to an air opening of the computer, and an opposite end of the ducting means is attached to the heat sink module by screws or hooking means. Heat is dissipated by the heat sink and blown out of the computer through the ducting means.

However, during assembly and disassembly of the computer, the ducting means must be respectively attached to and removed from the heat sink module. This is unduly cumbersome and time-consuming. In addition, each ducting means is sized such that it can only be used with one type of heat sink module. That is, heat sink modules of varying sizes each require individual ducting means having correspondingly varying sizes.

Thus an improved heat dissipating assembly for electronic packages which overcomes the above-mentioned problems is desired.

SUMMARY OF THE INVENTION

Accordingly, an object of the present invention is to provide a heat dissipating assembly which comprises an air guide device for efficiently cooling an electronic package.

Another object of the present invention is to provide a heat dissipating assembly incorporating an air guide device which is easy to assemble and disassemble.

To achieve the above-mentioned objects, a heat dissipating assembly in accordance with a preferred embodiment of the present invention comprises a heat sink module mounted on an electronic package, and an air guide device adapted for communication with an air opening of a computer enclosure. The heat sink module comprises a heat sink, and a fan mounted on the heat sink. The air guide device comprises a duct attached to the enclosure at the air opening, and a hood. The hood has a connection portion adjustably connected to the duct, and a cover portion extending from an end of the connection portion. The duct defines a plurality of annular grooves in an outer circumferential surface thereof, and the connection portion of the hood forms a plurality of protrusions on an inner surface thereof. The protrusions are engaged in selected annular grooves, to retain the hood on the duct at a desired position. The cover portion of the hood is near to and aligned with the fan. Heated air blown by the fan passes directly through the duct and out of the enclosure. Alternatively, the fan may instead be attached to the enclosure at the air opening. In such an arrangement, the fan blows cooling air from outside the enclosure to the heat sink via the air guide device.

In an alternative embodiment of the present invention, the duct defines a plurality of annular grooves in an inner surface thereof, and the connection portion of the hood comprises a plurality of protrusions formed on an outer surface thereof. The protrusions are engaged in selected annular grooves to retain the hood on the duct at a desired position.

Other objects, advantages and novel features of the present invention will be drawn from the following detailed description of preferred embodiments of the present invention with the attached drawings, in which:

DESCRIPTION OF THE PREFERRED EMBODIMENTS

Figure 1:
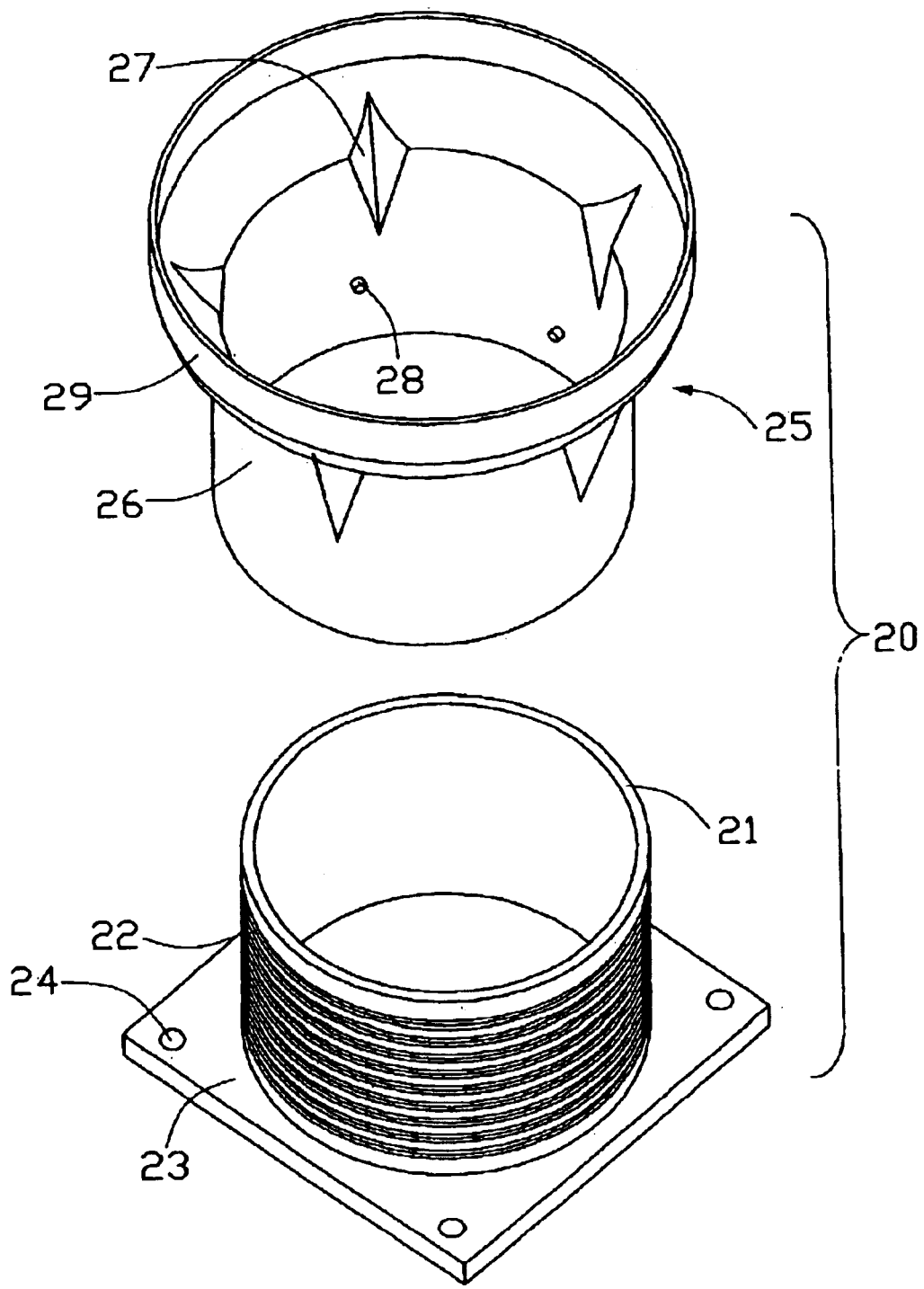
FIG. 1 is an exploded, isometric view of an air guide device in accordance with a preferred embodiment of the present invention.

Referring to FIG. 1, an air guide device 20 in accordance with a preferred embodiment of the present invention comprises a duct 21, and a hood 25 adjustably connected to the duct 21. The duct 21 and the hood 25 are both made of flexible material such as plastic.

The duct 21 defines a plurality of annular grooves 22 around an outer circumferential surface thereof. The duct 21 comprises a mounting plate 23 at one end thereof. Four mounting holes 24 are defined in four corners of the mounting plate 23 respectively.

The hood 25 comprises a connection portion 26 for connecting to the duct 22, and a cover portion 29 extending from an end of the connection portion 26. A diameter of the cover portion 29 is greater than a diameter of the connection portion 26. A plurality of ribs 27 is outwardly formed where the connection portion 26 adjoins the cover portion 29, for reinforcing a mechanical strength of the hood 25. A plurality of protrusions 28 is formed on an inner surface of the connection portion 26, for engaging in selected annular grooves 22 of the duct 21. Because the duct 21 and the hood 25 are made of flexible material, they can both easily deform to enable the protrusions 28 to ride over the duct 21 between one or more of the annular grooves 22. In the preferred embodiment, the protrusions 28 are offset from each other relative to a central longitudinal axis of the connection portion 26. This enables the protrusions 28 to engage in different annular grooves 22, thereby making connection of the hood 25 to the duct 21 more stable.

Figure 2:
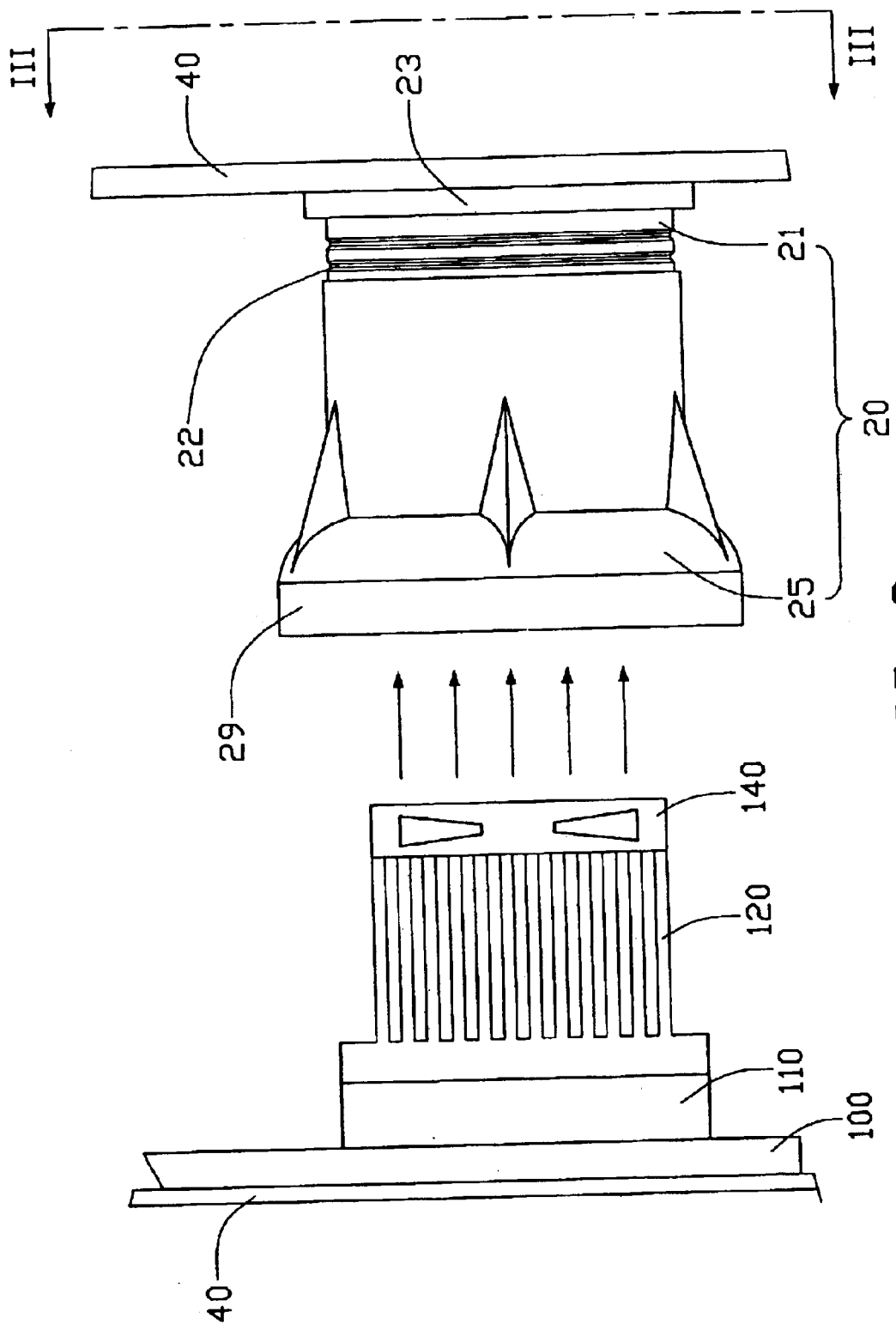
FIG. 2 is a side elevation view of a heat dissipating assembly in accordance with a preferred embodiment of the present invention, the heat dissipating assembly incorporating the air guide device of FIG. 1 fully assembled.
Figure 3:
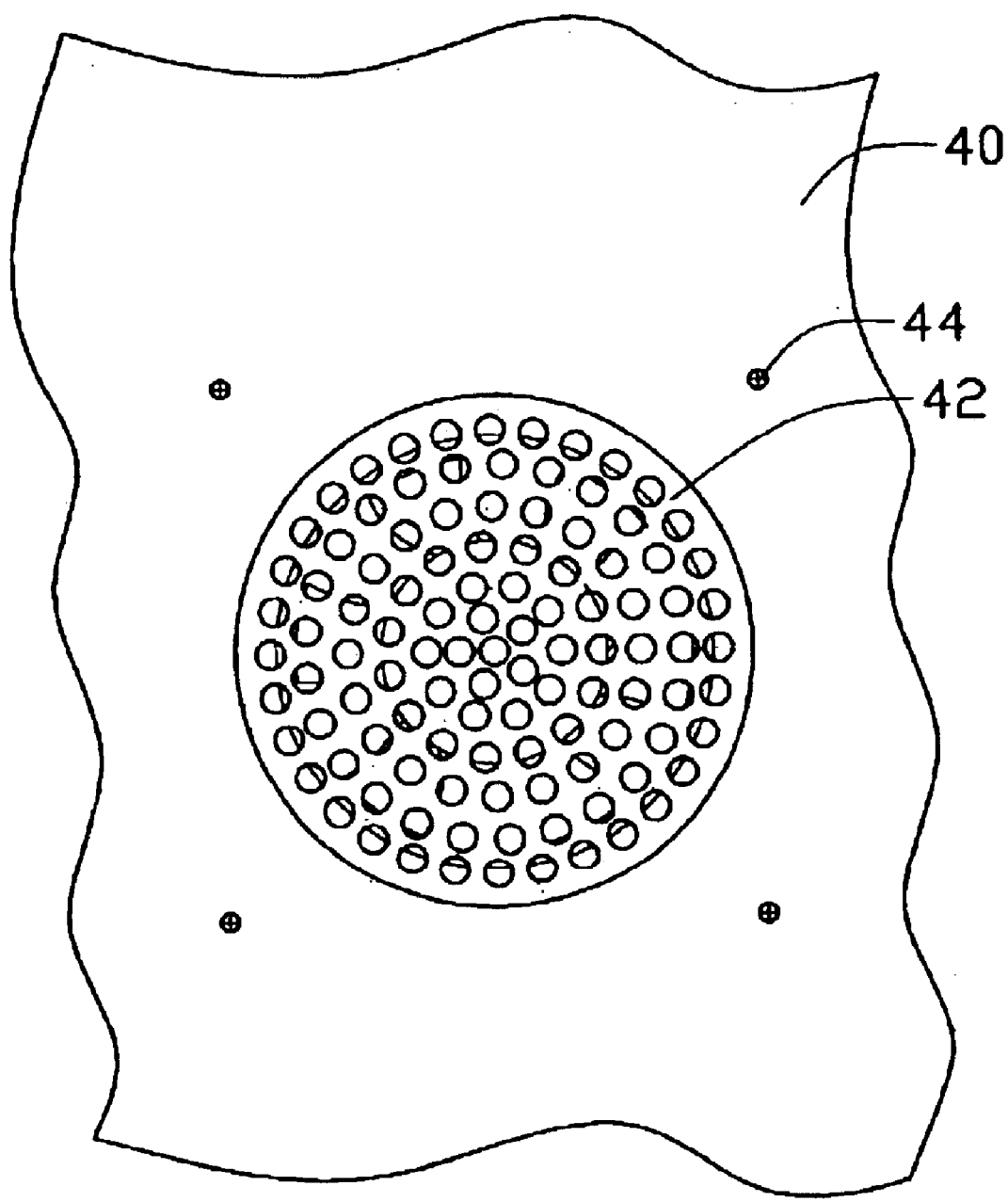
FIG. 3 is a side elevation view of FIG. 2, taken along line III—III of FIG. 2.

Referring to FIGS. 2 and 3, a heat sink module comprises a heat sink 120 and a fan 140 mounted on the heat sink 120. The heat sink module is attached on an electronic package 110 mounted on a motherboard 100, to dissipate heat generated by the electronic package 110.

In assembly and use of the air guide device 20, the hood 25 is attached on the duct 21 so that the hood 25 substantially surrounds the duct 21. The air guide device 20 is thus formed. The mounting plate 23 of the duct 21 is fixedly attached to an inside face of a computer enclosure 40 at an air opening 42 of the enclosure 40, using four screws 44. The hood 25 is moved toward the heat sink module so that the hood 25 is near to and aligned with the fan 140. Preferably, the hood 25 substantially surrounds the fan 140, or at least partially surrounds the fan 140. A complete heat dissipating assembly is thus formed. Practically all hot air blown by the fan 140 away from the heat sink 120 passes directly through the air guide device 20 and out of the enclosure 40. The cooling efficiency of the heat sink module is accordingly enhanced.

In addition, the air guide device 20 is not connected to the heat sink module. Therefore, installation and removal of the air guide device 20 in and from the enclosure 40 is simplified. Furthermore, manufacturing of the air guide device 20 is also simplified. Moreover, because the hood 25 is adjustably connected to the duct 21, the air guide device 20 can be used with any of a variety of heat sink modules having different shapes and profiles.

Figure 4:
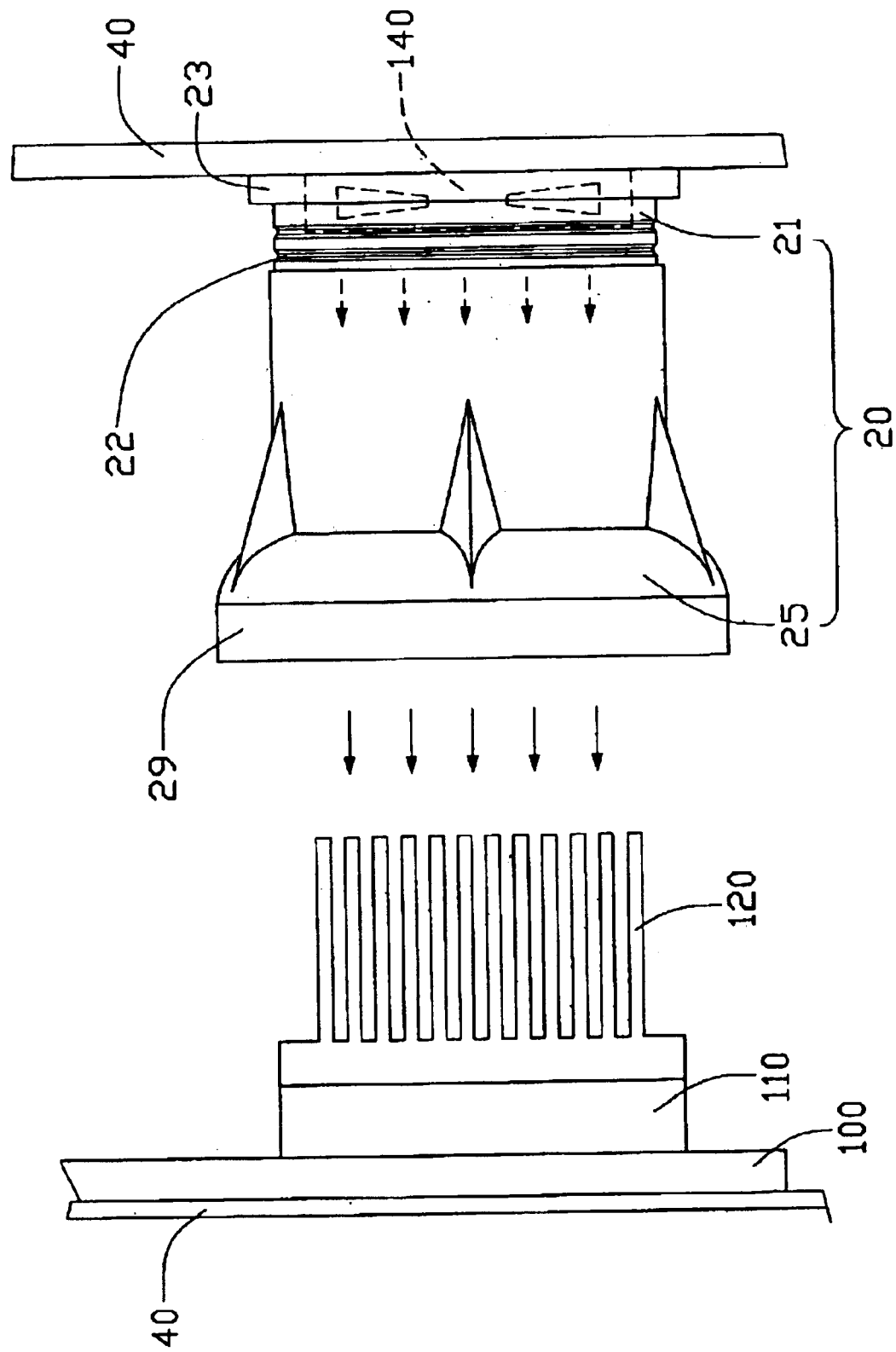
FIG. 4 is similar to FIG. 2, but shown a fan of the heat dissipating assembly in an alternative position and performing an alternative function.

In the embodiment described above, the fan 140 blows the heated air out of the enclosure 40 via the air guide device 20. Referring to FIG. 4, the fan 140 may instead be attached to the enclosure 40 at the air opening 42 thereof. In such an arrangement, the fan 140 blows cooling air from outside the enclosure 40 to the heat sink 120 via the air guide device 20.

Figure 5:
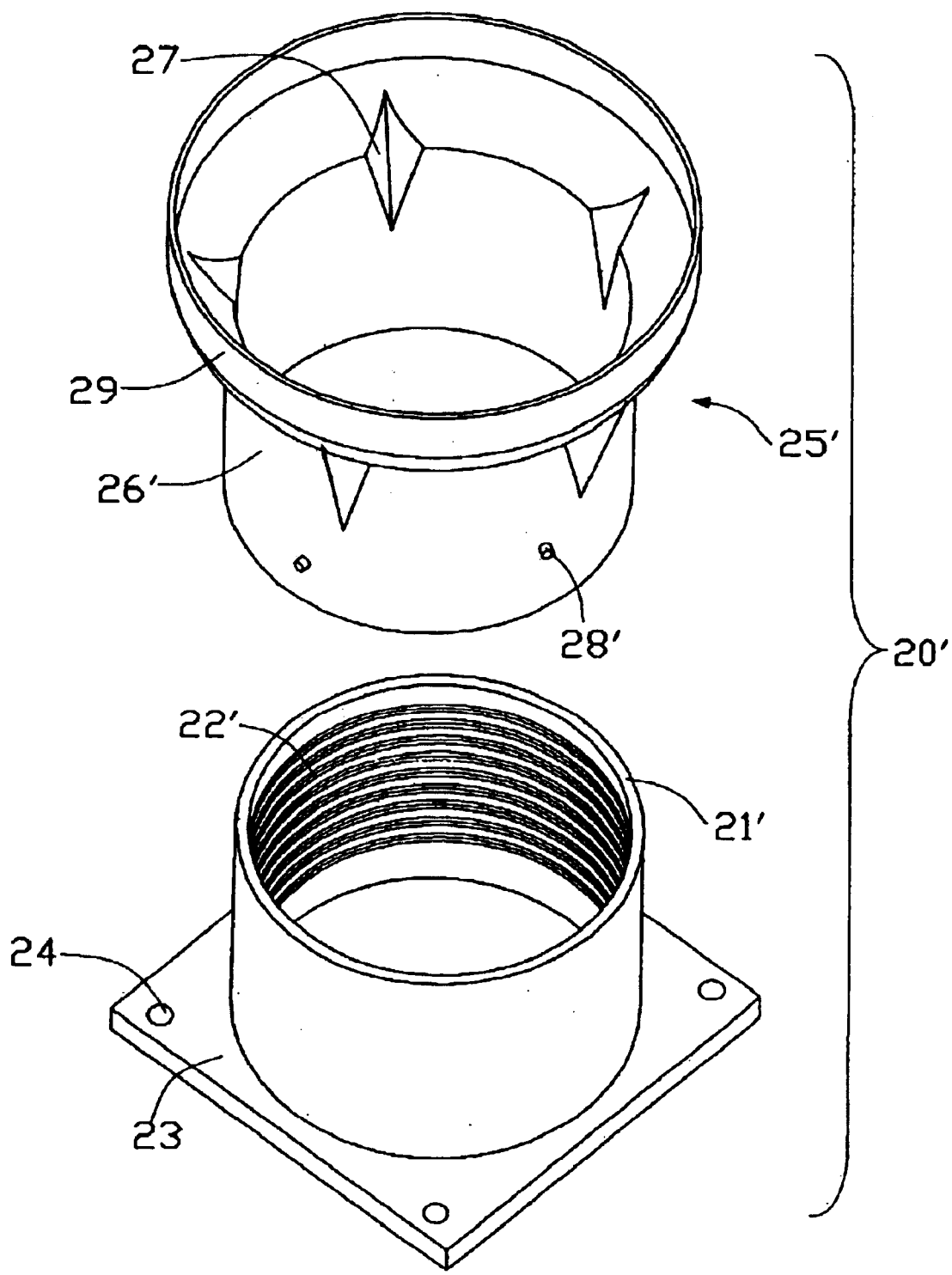
FIG. 5 is an exploded, isometric view of an air guide device in accordance with an alternative embodiment of the present invention.

FIG. 5 illustrates an air guide device 20' in accordance with an alternative embodiment of the present invention. The air guide device 20' is substantially the same as the air guide device 20 of the preferred embodiment. However, a duct 21' defines a plurality of annular grooves 22' in an inner surface thereof. A connection portion 26' of a hood 25' forms a plurality of protrusions 28' on an outer surface thereof. The protrusions 28' are engaged in selected annular grooves 22' of the duct 21', thereby adjustably connecting the hood 25' to the duct 21'.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A heat dissipating assembly comprising:
   a heat sink module comprising a heat sink and a fan mounted on the heat sink; and
   an air guide device adapted for communication with an air opening of an enclosure, the air guide device comprising a duct and a hood adjustably connected to the duct, the hood aligned with the fan whereby heated air blown by the fan passes through the duct and out of the enclosure.

2. The heat dissipating assembly as described in claim 1, wherein the hood comprises a connection portion adjustably connected to the duct, and a cover portion extending from an end of the connection portion, and a diameter of the cover portion is greater than a diameter of the connection portion.

3. The heat dissipating assembly as described in claim 1, wherein the cover portion of hood at least partially surrounds the fan.

4. The heat dissipating assembly as described in claim 2, wherein the duct defines a plurality of annular grooves in an outer surface thereof, and the connection portion of the hood comprises a plurality of protrusions arranged on an inner surface thereof and engaged in selected one or more of the annular grooves.

5. The heat dissipating assembly as described in claim 2, wherein the duct defines a plurality of annular grooves in an inner surface thereof, and the connection portion of the hood comprises a plurality of protrusions arranged on an outer surface thereof and engaged in selected one or more of the annular grooves.

6. The heat dissipating assembly as described in claim 2, wherein the hood further comprises a plurality of ribs outwardly formed where the connection portion joins the cover portion.

7. An air guide device for facilitating cooling of an electronic package in a computer system, the air guide device comprising:
   a duct adapted for communication with an air opening of the computer system, the duct defining a plurality of annular grooves in a circumferential surface thereof; and
   a hood for aligning with the electronic package, the hood comprising a plurality of protrusions on a circumferential surface thereof;
   wherein the protrusions of the hood are engaged in selected one or more of the grooves of the duct to adjustably connect the hood to the duct, whereby heated air from the electronic package can pass directly through the duct and out of the computer system, or cooling air from outside the computer system can pass through the duct directly to the electronic package.

8. The air guide device as described in claim 7, wherein the hood comprises a connection portion, and a cover portion extending from an end of the connection portion, and a diameter of the cover portion is greater than a diameter of the connection portion.

9. The air guide device as described in claim 8, wherein the annular grooves are defined in an outer surface of the duct, and the protrusions are provided on an inner surface of the connection portion of the hood.

10. The air guide device as described in claim 8, wherein the annular grooves are defined in an inner surface of the duct, and the protrusions are provided on an outer surface of the connection portion of the hood.

11. The air guide device as described in claim 8, wherein the hood further comprises a plurality of ribs outwardly formed where the connection portion joins the cover portion.

12. A heat dissipating assembly comprising:
   a heat sink;
   a fan adapted for mounting to an enclosure; and
   an air guide device adapted for communication with an air opening of the enclosure, the air guide device comprising a duct and a hood adjustably connected to the duct, the hood aligned with the heat sink whereby cooling air blown by the fan passes through the duct to the heat sink.

13. The heat dissipating assembly as described in claim 12, wherein the hood comprises a connection portion adjustably connected to the duct, and a cover portion extending from an end of the connection portion, and a diameter of the cover portion is greater than a diameter of the connection portion.

14. The heat dissipating assembly as described in claim 12, wherein the cover portion of hood at least partially surrounds the heat sink.

15. The heat dissipating assembly as described in claim 13, wherein the duct defines a plurality of annular grooves in an outer surface thereof, and the connection portion of the hood comprises a plurality of protrusions arranged on an inner surface thereof and engaged in selected one or more of the annular grooves.

16. The heat dissipating assembly as described in claim 13, wherein the duct defines a plurality of annular grooves in an inner surface thereof, and the connection portion of the hood comprises a plurality of protrusions arranged on an outer surface thereof and engaged in selected one or more of the annular grooves.

17. The heat dissipating assembly as described in claim 13, wherein the hood further comprises a plurality of ribs outwardly formed where the connection portion joins the cover portion.

18. An electrical assembly comprising:

a pair of side plates of an enclosure facing to an exterior and commonly defining a space therebetween;

a relative short distance defined between said pair of side plates in comparison with a lengthwise direction of said pair of plates;

a heat generating component assembly mounted on a printed circuit board in the space and located adjacent to one of said pair of plates;

an air guide device located in the space and mounted on the other of said pair of plates; and said air guide device including a duct mounted upon the other of said pair of plates and aligned with an air opening formed in said other of said pair of plates, and a hood slidably mounted on said duct in a direction toward said heat generating component assembly; wherein one of said heat generating component and said air guide device is equipped with a fan directing to the other.

\* \* \* \* \*